United States Patent
Sugioka

(10) Patent No.: US 10,685,855 B2
(45) Date of Patent: Jun. 16, 2020

(54) SUBSTRATE TREATING DEVICE AND SUBSTRATE TREATING METHOD

(71) Applicant: SCREEN Holdings Co., Ltd., Kyoto (JP)

(72) Inventor: Shinji Sugioka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/710,095

(22) Filed: Sep. 20, 2017

(65) Prior Publication Data

US 2018/0090340 A1   Mar. 29, 2018

(30) Foreign Application Priority Data

Sep. 23, 2016 (JP) ................................. 2016-185928

(51) Int. Cl.
| | |
|---|---|
| *H01L 21/67* | (2006.01) |
| *B08B 3/04* | (2006.01) |
| *H01L 21/02* | (2006.01) |
| *H01L 21/66* | (2006.01) |
| *H01L 21/311* | (2006.01) |

(52) U.S. Cl.
CPC .......... *H01L 21/67023* (2013.01); *B08B 3/04* (2013.01); *H01L 21/02068* (2013.01); *H01L 21/67017* (2013.01); *H01L 21/67057* (2013.01); *H01L 21/67086* (2013.01); *H01L 21/67253* (2013.01); *H01L 22/20* (2013.01); *H01L 21/31111* (2013.01)

(58) Field of Classification Search
CPC ......... H01L 21/67023; H01L 21/02068; H01L 21/67017; H01L 21/67057; H01L 21/67086; H01L 21/67253; H01L 21/31111; H01L 22/20; B08B 3/04
See application file for complete search history.

(56) References Cited

U.S. PATENT DOCUMENTS

| | | | |
|---|---|---|---|
| 5,845,660 A | 12/1998 | Shindo et al. | ........... 134/56 |
| 5,855,792 A * | 1/1999 | Adams | ........... C02F 9/00 134/10 |
| 2002/0001967 A1 * | 1/2002 | Yokomizo | ........ H01L 21/31111 438/745 |

(Continued)

FOREIGN PATENT DOCUMENTS

| | | |
|---|---|---|
| JP | 2001-269633 A | 10/2001 |
| JP | 2003-257932 A | 9/2003 |

(Continued)

*Primary Examiner* — Sharidan Carrillo
(74) *Attorney, Agent, or Firm* — Ostrolenk Faber LLP

(57) ABSTRACT

The substrate treating device performs a predetermined treatment on a substrate by immersing the substrate into a treating liquid that contains a predetermined chemical liquid and pure water. Further, the substrate treating device includes a treating tank in which a treating liquid with which a predetermined treatment is performed on the substrate is stored, a supply unit that supplies a chemical liquid or pure water to the treating tank, a discharge unit that discharges the treating liquid stored in the treating tank, and a control unit that controls supply of the treating liquid or the pure water by the supply unit. The control unit causes the supply unit to supply the chemical liquid or the pure water during performing the predetermined treatment.

8 Claims, 8 Drawing Sheets

(56) References Cited

U.S. PATENT DOCUMENTS

| | | | |
|---|---|---|---|
| 2005/0230045 A1* | 10/2005 | Okuchi | H01L 21/31111 156/345.18 |
| 2007/0102023 A1 | 5/2007 | Yi et al. | 134/10 |
| 2008/0023444 A1 | 1/2008 | Osawa | 216/83 |
| 2008/0236639 A1* | 10/2008 | Kimura | H01L 21/67057 134/57 R |
| 2010/0210110 A1 | 8/2010 | Okuchi et al. | 438/694 |
| 2012/0199555 A1 | 8/2012 | Osawa | 216/84 |
| 2013/0240143 A1 | 9/2013 | Kiyose et al. | 156/345.15 |
| 2013/0312789 A1* | 11/2013 | Uchibe | B08B 3/12 134/1.3 |
| 2014/0206110 A1* | 7/2014 | Lee | H01L 21/30608 438/16 |
| 2015/0221530 A1 | 8/2015 | Hara et al. | |
| 2018/0090340 A1* | 3/2018 | Sugioka | H01L 21/67017 |
| 2018/0090346 A1* | 3/2018 | Sugioka | C09K 13/00 |

FOREIGN PATENT DOCUMENTS

| | | |
|---|---|---|
| JP | 2004-146489 A | 5/2004 |
| JP | 2005-310948 A | 11/2005 |
| JP | 2008-053680 A | 3/2008 |
| JP | 2008-235812 A | 10/2008 |
| JP | 2012-074552 A | 4/2012 |
| JP | 2013-093478 A | 5/2013 |
| JP | 2013-165217 A | 8/2013 |
| JP | 2015-144221 A | 8/2015 |
| KR | 10-0390545 B1 | 9/2003 |
| KR | 10-0655429 B1 | 12/2006 |
| KR | 10-2008-0010306 A | 1/2008 |
| KR | 10-2009-0032286 A | 4/2009 |
| KR | 10-2013-0023395 | 3/2013 |

* cited by examiner

SUBSTRATE TREATING DEVICE AND SUBSTRATE TREATING METHOD

CROSS-REFERENCE TO RELATED APPLICATION

This application is based upon and claims the benefit of priority of the prior Japanese Patent Application No. 2016-185928, filed on Sep. 23, 2016 the entire contents of which are incorporated herein by reference.

BACKGROUND

Technical Field

The present invention relates to a substrate treating device and a substrate treating method for performing an etching treatment and a washing treatment on a substrate of a semiconductor wafer and a relevant item by immersing the substrate into a treating tank. Particularly, the present invention relates to concentration control of a treating liquid in the treating tank.

A manufacturing process of a semiconductor device includes a step of performing an etching treatment and a washing treatment on a substrate of a semiconductor wafer and a relevant item, by immersing the substrate into a treating tank. Such a step is performed by a substrate treating device that includes a plurality of treating tanks. A concentration of the treating liquid in each treating tank of the substrate treating device changes in some cases, due to evaporation and decomposition of a treating-liquid constituent component, along with lapse of time. Therefore, there has been performed concentration control for maintaining the concentration of the treating liquid within a range suitable for the etching treatment and the washing treatment.

As such a technique, the following technique is well-known. That is, in this technique, when the concentration measured by a concentration measuring unit is not within a normal concentration range, the concentration is determined to be abnormal, and thus a total-quantity liquid replacement is performed (refer to JP 2012-74552 A, for example). In the case of the concentration being within the normal concentration range, when the concentration is within a target concentration range (FIG. 5: S0+, S0−), the substrate is treated with a treating liquid of the measured concentration. When the concentration is within a first concentration range (FIG. 5: S1+, S1−), the concentration is corrected by replenishing the treating liquid by a predetermined quantity. When the concentration is within a second concentration range (FIG. 5: S2+, S2−), the treating liquid is discharged by a predetermined quantity and then the treating liquid is replenished by a predetermined quantity. Since there are a plurality of concentration correction ranges, the concentration can be stably controlled. Total quantity replacement of the treating liquid, replenishment of the treating liquid, or discharge and replenishment of the treating liquid is performed after a lot is treated and then carried out, or is performed in the state of waiting for input of a lot (JP 2012-74552 A, FIGS. 3 and 4).

That is, because the concentration and temperature of the treating liquid are factors that affect success or failure of the treatment of a lot, replenishment and discharge are avoided during the treatment. However, in recent years, there is a process in which the quantity of an object to be etched dissolved by one treatment to a lot, such as formation of a three-dimensional NAND, is larger than a conventional quantity. In such a case, there is a large change in the concentration of a treating liquid during treating of a lot. Therefore, it has been impossible in some cases to maintain a concentration in which dissolution reaction to the etching sufficiently progresses.

SUMMARY OF THE INVENTION

Therefore, an object of the present invention is to provide a technique for stabilizing the concentration of a treating liquid within a treating tank, even when the quantity of an object to be etched dissolved by one etching treatment is large.

In order to solve the above problem, the present invention has the following configuration. A substrate treating device that performs a predetermined treatment on a substrate by immersing the substrate into a treating liquid that contains a predetermined chemical liquid and pure water. The substrate treating device includes: a treating tank in which the treating liquid with which the predetermined treatment is performed on the substrate is stored; a supply unit that supplies the chemical liquid or the pure water to the treating tank; a discharge unit that discharges the treating liquid stored in the treating tank; and a control unit that controls supply of the chemical liquid or the pure water performed by the supply unit. The control unit causes the supply unit to supply the chemical liquid or the pure water, during performing the predetermined treatment.

According to the present invention, a chemical liquid or pure water is supplied also during performing a predetermined treatment. Therefore, the concentration of the treating liquid can be adjusted, also during the execution of a process in which the quantity of a silicon nitride film dissolved in the treating liquid in the etching, such as formation of a three-dimensional NAND, for example, is larger than the quantity in the conventional treatment.

The treating tank may have an inner tank in which the predetermined treatment is performed on the substrate, and an outer tank which is provided around the inner tank and into which the treating liquid that overflows from the inner tank flows. The substrate treating device may include a circulation path for recirculating the treating liquid from the outer tank to the inner tank. The supply unit may supply the chemical liquid or the pure water to the outer tank. A rapid change in the concentration of the treating liquid around the substrate can be suppressed, by replenishing the treating liquid into a tank separate from the tank in which the substrate is located.

The circulation path may include a temperature adjuster that adjusts a temperature of the treating liquid inside the circulation path, and a filtering unit that filters the treating liquid passing through the circulation path. With this arrangement, impurities can be removed from the treating liquid, and a rapid change in the temperature of the treating liquid around the substrate can be suppressed.

The discharge unit may be an overflow pipe provided on a vertically upper part of a side surface of the outer tank. With this arrangement, particles of impurities generated by etching and floating on the liquid surface of the treating liquid in the outer tank can be easily removed.

The supply unit may be configured to include a preliminary temperature adjuster that adjusts a temperature of the chemical liquid or the pure water. With this arrangement, a rapid change in the temperature of the treating liquid within the treating tank can be suppressed.

The substrate treating device may further include a concentration measuring unit that measures a concentration of a predetermined component of the treating liquid. The control unit may control a quantity of the chemical liquid or the pure water supplied by the supply unit, in accordance with the concentration measured by the concentration measuring unit. Specifically, the treating liquid can be suitably replenished in accordance with a change in the concentration of the treating liquid, by replenishing the treating liquid by using the concentration as a key.

The control unit may be configured to control the quantity of the chemical liquid or the pure water supplied by the supply unit, based on a lapse time of the predetermined treatment. In this case, an approximate change in the concentration of the treating liquid following the lapse time can be known in advance. Therefore, a suitable replenishment can be also performed, by a method of replenishing the treating liquid by a quantity defined in advance by using the lapse time as a key. Further, a supply quantity of a chemical liquid or pure water may be determined in accordance with the number of substrates to be treated.

Further, the substrate treating device may further include a regeneration treating unit that precipitates a solute, dissolved in the treating liquid from the substrate in the predetermined treatment, out of the treating liquid discharged by the discharge unit, removes the solute, and regenerates the treating liquid. The regeneration treating unit may supply the regenerated treating liquid to the treating tank. With this arrangement, the treating liquid can be reused.

The above substrate treating device can be also specified as a substrate treating method performed by the device. Means for solving the above problem can be used by appropriately combining together.

According to the present invention, the concentration of a treating liquid within a treating tank can be stabilized, even when the quantity of an object to be etched dissolved by one etching treatment is large.

DETAILED DESCRIPTION OF PREFERRED EMBODIMENTS

Embodiments of the present invention will be described in detail below with reference to the drawings. The embodiments described below represent one mode of the invention of the present application, and do not limit the technical range of the invention of the present application.

First Embodiment

Figure 1:
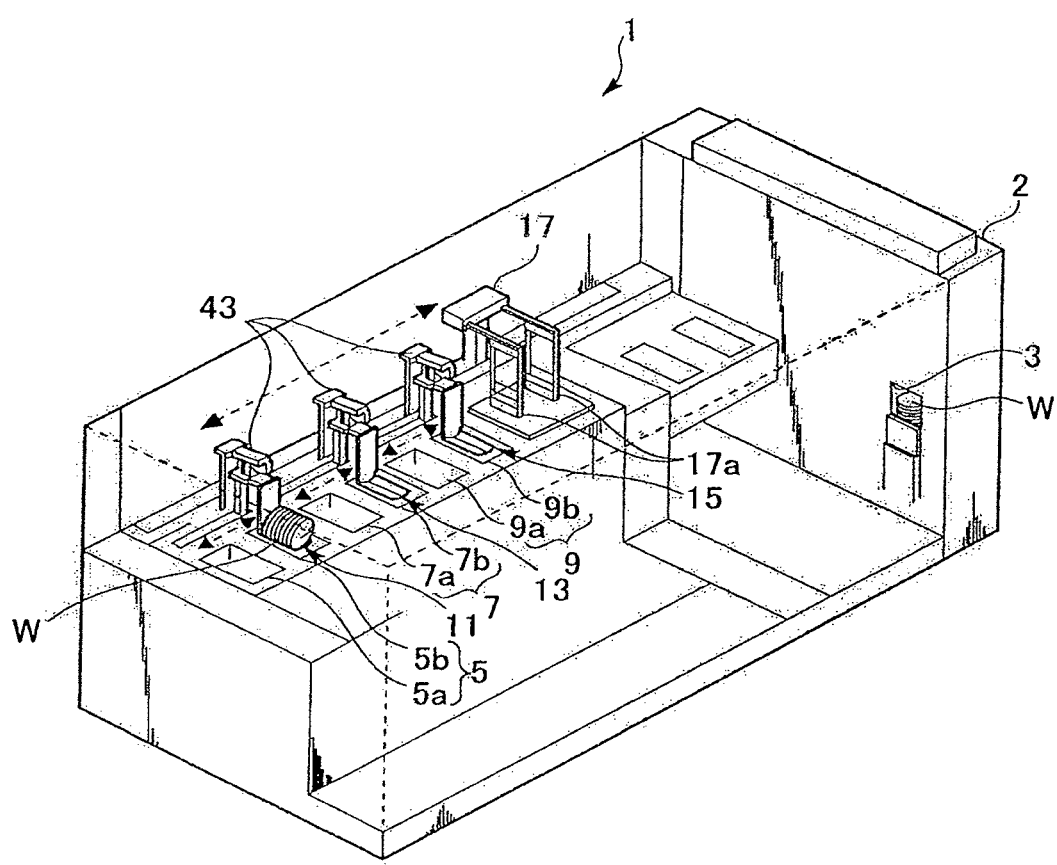
FIG. 1 is a perspective view showing a schematic configuration of a substrate treating device according to a first embodiment.

FIG. 1 is a perspective view showing a schematic configuration of a substrate treating device 1 according to a first embodiment. The substrate treating device 1 performs an etching treatment and a washing treatment (hereinafter, also simply referred to as a "treatment") on mainly a substrate (for example, a semiconductor substrate) W. In the substrate treating device 1, a buffer section 2 that stocks the substrate W is disposed on a right depth side in FIG. 1. On a further right depth side of the buffer section 2, a front panel (not shown) for operating the substrate treating device 1 is provided. Further, on an opposite side of the front panel of the buffer section 2, a substrate carry-out port 3 is provided. Further, treating units 5, 7, and 9 that perform a treatment on the substrate W are arranged in parallel from an opposite side of the buffer section 2 (a left front side in FIG. 1) in a longitudinal direction of the substrate treating device 1.

The treating units 5, 7, and 9 have two treating tanks 5a and 5b, two treating tanks 7a and 7b, and two treating tanks 9a and 9b, respectively. The substrate treating device 1 also includes sub-conveying mechanisms 43 that move a plurality of substrates W, in a direction and in a range indicated by a short arrow in FIG. 1, between treating tanks 5a and 5b, between treating tanks 7a and 7b, and between treating tanks 9a and 9b respectively included in the treating units 5, 7, and 9. The sub-conveying mechanisms 43 also vertically move the plurality of substrates W in order to immerse the plurality of substrates W into the treating tanks 5a and 5b, 7a and 7b, and 9a and 9b, or lift the substrates W from the treating tanks 5a and 5b, 7a and 7b, and 9a and 9b. The sub-conveying mechanisms 43 respectively include lifters 11, 13, and 15 for holding the plurality of substrates W. Further, the substrate treating device 1 includes a main conveying mechanism 17 which is movable in a direction and in a range indicated by a long arrow in FIG. 1, in order to convey the plurality of substrates W to each of the treating units 5, 7, and 9.

The main conveying mechanism 17 has two movable arms 17a. The arms 17a have a plurality of grooves (not shown) on which the substrates W are placed. The arms 17a hold, in the state shown in FIG. 1, substrates W in a standing posture (a posture in which the normal line of a substrate main surface is laid along the horizontal direction). The two arms 17a of the main conveying mechanism 17 swing in an upside-down shape of a character "V" when viewed from a right diagonally lower direction in FIG. 1, thereby releasing each substrate W. With the above operation, each substrate W can be delivered between the main conveying mechanism 17 and the lifters 11, 13, and 15.

Figure 2:
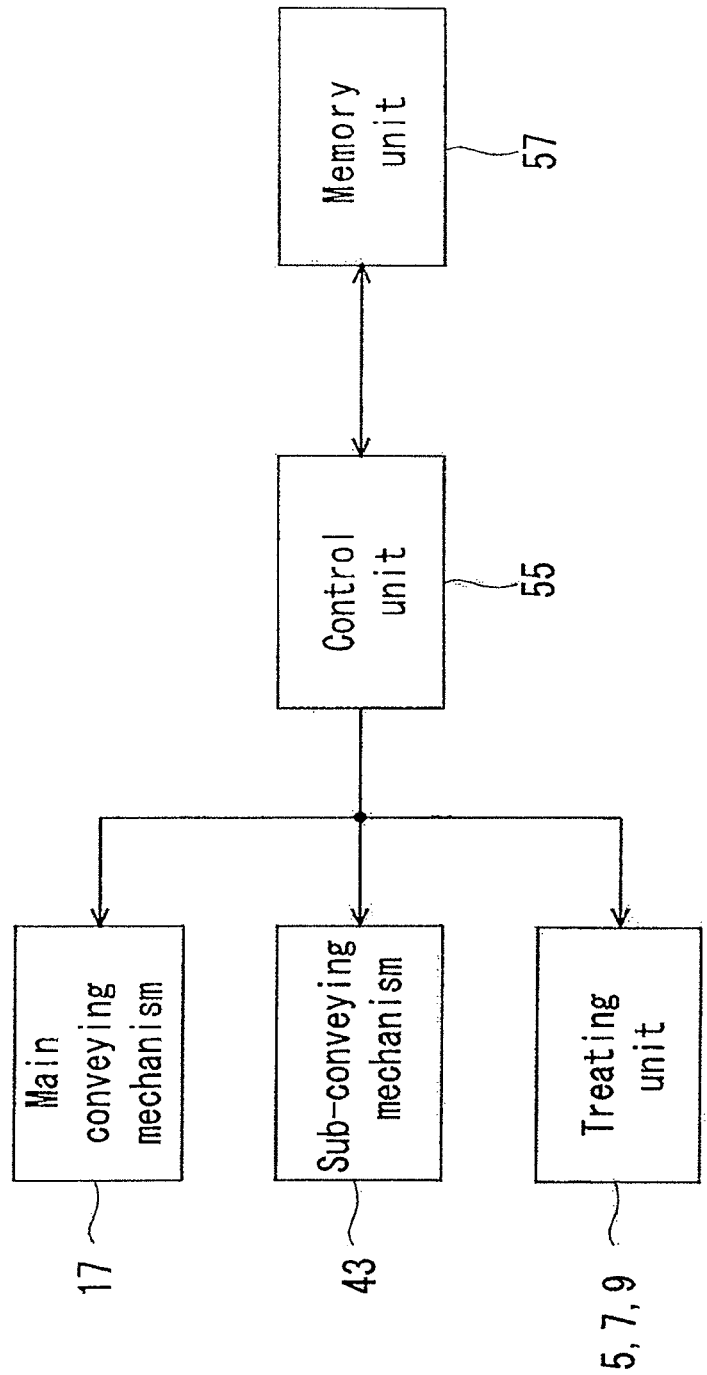
FIG. 2 is a functional block diagram of the substrate treating device according to the first embodiment.

FIG. 2 shows a functional block diagram of the substrate treating device 1. The main conveying mechanism 17, the sub-conveying mechanisms 43, and the treating units 5, 7, and 9 are integrally controlled by a control unit 55. The configuration of the control unit 55 as hardware is similar to the configuration of a general computer. That is, the control unit 55 includes, for example, a CPU that performs various arithmetic processing, a ROM which is a read-only memory that stores a basic program, a RAM which is a writable and readable memory that stores various information items, and a magnetic disc that stores control application and data. In the present embodiment, the CPU of the control unit 55 controls each unit such that each unit executes a predetermined program to convey the substrates W to the treating units 5, 7, and 9 and each unit performs a treatment in accordance with the program. The program is stored in a memory unit 57. The memory unit 57 holds in advance threshold values and other parameters that are a standard for the program to operate.

Figure 3:
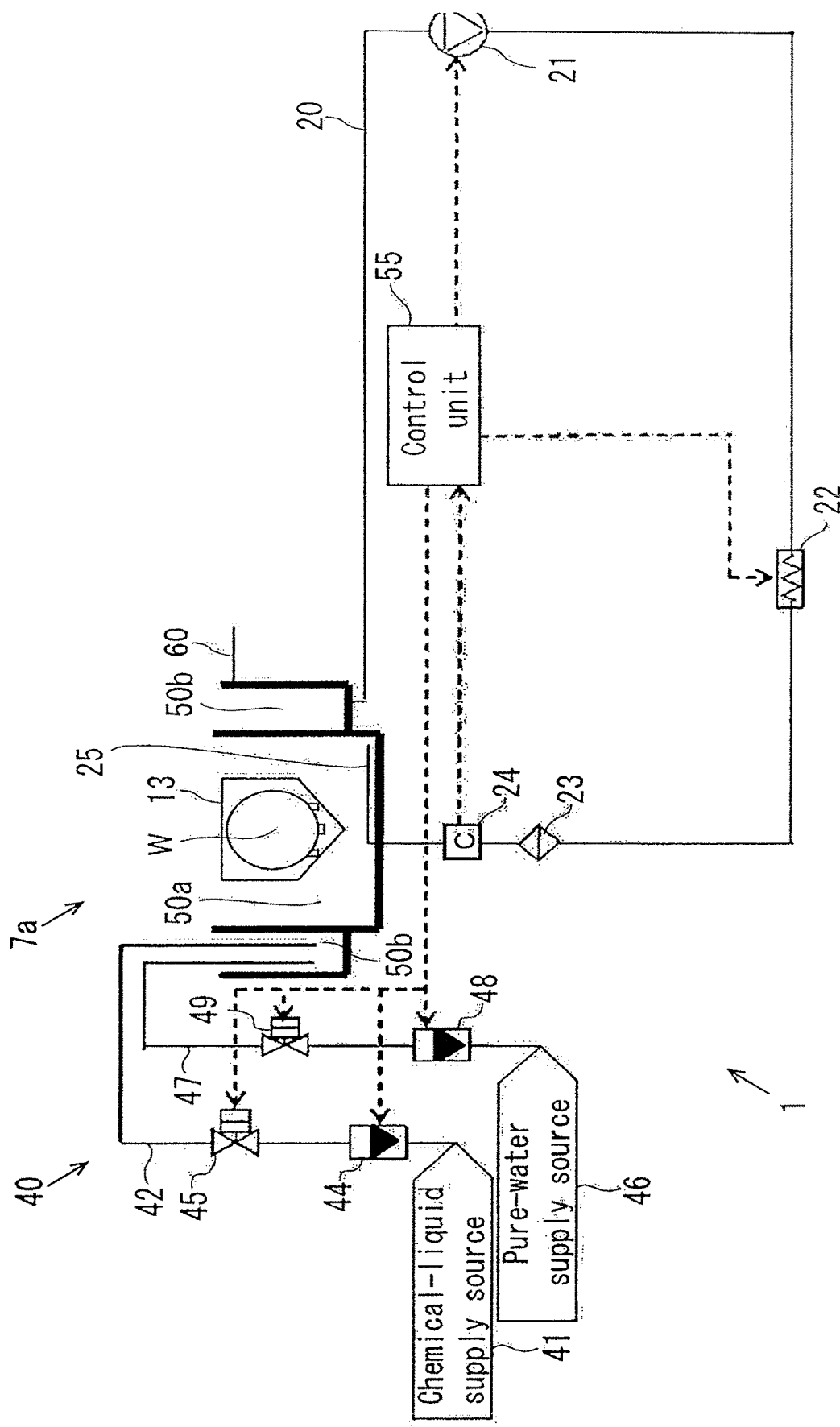
FIG. 3 is a diagram showing a configuration concerning the control of a treating liquid in each of treating tanks of treating units of the substrate treating device according to the first embodiment.

FIG. 3 is a diagram showing a configuration concerning the control of a treating liquid in each of the treating tanks 5a, 7a, and 9a respectively included in the treating units 5, 7, and 9 of the substrate treating device 1. With reference to FIG. 3, a description will be made by taking the treating tank 7a as an example, out of the treating tanks 5a, 7a, and 9a respectively included in the treating units 5, 7, and 9. A control equivalent to or similar to the control of the treating liquid in the treating tank 7a is also applied to cases of the treating tanks 5a and 9a.

In a manufacturing process of a semiconductor wafer, a monocrystalline ingot of silicon, for example, is sliced in a rod axis direction of the ingot. The sliced wafers are sequentially subjected to chamfering, lapping, an etching treatment, a polishing treatment, and the like. As a result, a plurality of layers, structures, and circuits made of different materials are formed on the substrate surface. The etching treatment of the substrate W performed in the treating tank 7a is a process for forming a pattern on the semiconductor substrate, for example. The etching treatment is performed by immersing, for a predetermined time, the substrate W into a phosphoric acid aqueous solution ($H_3PO_4+H_2O$) or the like, which is a treating liquid, at a high temperature (150° C. to 160° C.), for the purpose of selectively removing a silicon nitride film (also described as a $Si_3N_4$ (SiN) film) with a silicon oxide film (a $SiO_2$ film) being left, out of the silicon nitride film and the silicon oxide film that are formed on the substrate.

In FIG. 3, the treating tank 7a has a double-tank structure configured by an inner tank 50a in which the substrate W is immersed into the treating liquid, and an outer tank 50b which is provided around the inner tank 50a and into which the treating liquid that overflows from the upper end of the inner tank 50a flows. The inner tank 50a is a box-shaped member formed in a rectangular shape in a plan view and formed of a quartz or fluororesin material excellent in corrosion resistance against the treating liquid. The outer tank 50b is formed of a material similar to the material of the inner tank 50a, and is provided to surround an outer peripheral upper part of the inner tank 50a.

The treating tank 7a is also provided with a lifter 13 for immersing the substrate W into the treating liquid stored as described above. The lifter 13 collectively holds, with three holding rods, a plurality of (for example, 50) substrates W that are arranged in parallel with each other in a standing posture. The lifter 13 is provided movably in vertical and lateral directions by the sub-conveying mechanisms 43. The lifter 13 can be moved up and down between a treatment position (a position in FIG. 3) at which a plurality of substrates W being held are immersed into the treating liquid within the inner tank 50a and a delivery position at which the plurality of substrates W are lifted upward from the treating liquid. The lifter 13 can be also moved to the adjacent treating tank 7b.

Further, the substrate treating device 1 includes a circulation line (corresponding to the "circulation path" in the present invention) 20 through which the treating liquid is circulated to the treating tank 7a. The circulation line 20 is a piping path for recirculating with pressure the treating liquid discharged from the treating tank 7a, by heating and filtering the treating liquid, into the treating tank 7a. Specifically, the circulation line 20 is configured by connecting, through the flow path, between the outer tank 50b and the inner tank 50a of the treating tank 7a. An inlet port to the circulation line 20 is provided on a lower part (a bottom surface in the example in FIG. 3) of the outer tank 50b. An outlet port 25 from the circulation line 20 is provided on a lower side (near the bottom surface) of the inner tank 50a.

In the middle of the path of the circulation line 20, there are provided, from the upstream side, a circulation pump 21, a temperature adjuster (corresponding to the "temperature adjusting unit" in the present invention) 22, a filter (corresponding to the "filtering unit" in the present invention) 23, and a concentration meter (corresponding to the "concentration measuring unit" in the present invention) 24. The circulation pump 21 draws the treating liquid from the outer tank 50b via the circulation line 20, and also sends the treating liquid with pressure toward the inner tank 50a. The temperature adjuster 22 heats the treating liquid flowing through the circulation line 20 to a predetermined treating temperature. A heater not shown is also provided in the treating tank 7a. The treating liquid stored in the treating tank 7a is also heated to maintain a predetermined treating temperature. The filter 23 is a filter for removing foreign matters included in the treating liquid flowing through the circulation line 20.

The concentration meter 24 measures a concentration of a predetermined component (SiN, for example) out of components of the treating liquid that is recirculated to the inner tank 50a through the circulation line 20. The concentration within the treating tank 7a is feedback controlled such that the concentration measured by the concentration meter 24 is adjusted to an optimum value.

Next, the operation of the substrate treating device 1 having the above configuration will be described more in detail. First, regardless of whether the substrate W is immersed in the treating liquid stored in the treating tank 7a, the circulation pump 21 always sends with pressure the treating liquid at a constant flow rate. The treating liquid recirculated to the treating tank 7a through the circulation line 20 is supplied from the bottom part of the inner tank 50a. Accordingly, an upflow of the treating liquid directed upward from the bottom part is generated inside the inner tank 50a. The treating liquid supplied from the bottom part in due course overflows from the upper end part of the inner tank 50a, and flows into the outer tank 50b. The treating liquid that flows into the outer tank 50b is sent from the outer tank 50b to the circulation pump 21 via the circulation line 20, and is recirculated with pressure again to the treating tank 7a. This circulation process is performed continuously.

The lifter 13 receives a plurality of substrates W at the delivery position while performing the circulation process of the treating liquid through the circulation line 20. The lifter 13 then falls to a treatment position, and immerses the substrates W into the treating liquid stored in the inner tank 50a. As a result, a treatment is performed for a predetermined time. After the treatment ends, the lifter 13 rises to the delivery position again and lifts the substrates W from the treating liquid. Thereafter, in the adjacent treating tank 7b, a water washing treatment of washing the substrates W with pure water is performed.

In addition to the above, the substrate treating device 1 includes a concentration control device (corresponding to the "supply unit" in the present invention) 40 for controlling the concentration of the treating liquid in the treating tank 7a. The concentration control device 40 has a chemical-liquid supply source 41, a chemical liquid line 42 that connects the chemical-liquid supply source 41 with the outer tank 50b, a pure-water supply source 46, and a pure water line 47 that connects the pure-water supply source 46 with the outer tank 50b.

The chemical liquid line 42 includes a chemical-liquid flowmeter 44 capable of measuring a flow rate of a passing chemical liquid (phosphoric acid), and a chemical-liquid replenishment valve 45 capable of adjusting the flow rate of the phosphoric acid. On the other hand, the pure water line 47 includes a pure-water flowmeter 48 that measures a flow rate of pure water passing through the pure water line 47, and a pure-water replenishment valve 49 that adjusts the flow rate of the pure water. Further, the control unit 55 controls, based on a measurement result of the concentration meter 24, the chemical-liquid replenishment valve 45 and the pure-water replenishment valve 49 such that the concentration of the treating liquid within the treating tank 7a is adjusted to the optimum concentration for the treatment.

The treating tank 7a (an upper part of an outer wall surface of the outer tank 50b in the example in FIG. 3) is provided with an discharge port (corresponding to the "discharge unit" in the present invention) 60 for discharging the treating liquid to the outside. The discharge port 60 is an overflow pipe for discharging the liquid when the level of the liquid within the outer tank 50b exceeds a predetermined height, for example. Specifically, the discharge port 60 is provided on an upper part of the outer wall of the outer tank 50b, at a position lower than the outer wall of the inner tank 50a, the outer wall of the inner tank 50a partitioning between the inner tank 50a and the outer tank 50b. In accordance with the quantity of the chemical liquid or the pure water supplied to the treating tank 7a by the concentration control device 40, a part of the treating liquid is discharged from the discharge port 60. Further, the outlet ports at the front ends of the chemical liquid line 42 and the pure water line 47 are positioned on a lower side of the outer tank 50b. In other words, the outlet ports of the chemical liquid line 42 and the pure water line 47 are provided near the inlet port of the circulation line 20 provided on the bottom surface of the outer tank 50b.

The chemical-liquid supply source 41 and the pure-water supply source 46 shown in FIG. 3 may be realized by preliminary temperature adjusters that preliminarily perform temperature adjustment. The preliminary temperature adjusters, for example, the chemical-liquid supply source 41 and the pure-water supply source 46, are provided in the adjacent treating tank 5b (for convenience sake, also referred to as a "preliminary temperature-adjusting units"). That is, in the substrate treating device 1 shown in FIG. 1, the treating liquid of which temperature is raised in advance in the treating tank 5b, for example, is supplied to the outer tank of the adjacent treating tank 7a. The treating tank 5b includes the treating tank 7a, the temperature adjuster 22, the filter 23, and the circulation pump 21 shown in FIG. 3, and performs temperature adjustment while circulating the treating liquid without treating the substrates W. Because the substrates W are not treated, a SiN concentration is zero. The treating liquid containing phosphoric acid and pure water is supplied to the chemical-liquid supply source 41 in FIG. 3 from a part of the circulation line 20 formed on the treating tank 5b. By opening the chemical-liquid replenishment valve 45, the treating liquid is added to the outer tank 50b of the treating tank 7a. When the treating tank 7a (the treating unit) that performs the etching treatment and the washing treatment on the substrates W, and the treating tank 5b (the preliminary temperature-adjusting unit) that performs preliminary temperature adjustment are made in the same configuration, the design of the unit and the process performance become common.

(Treatment)

Figure 4:
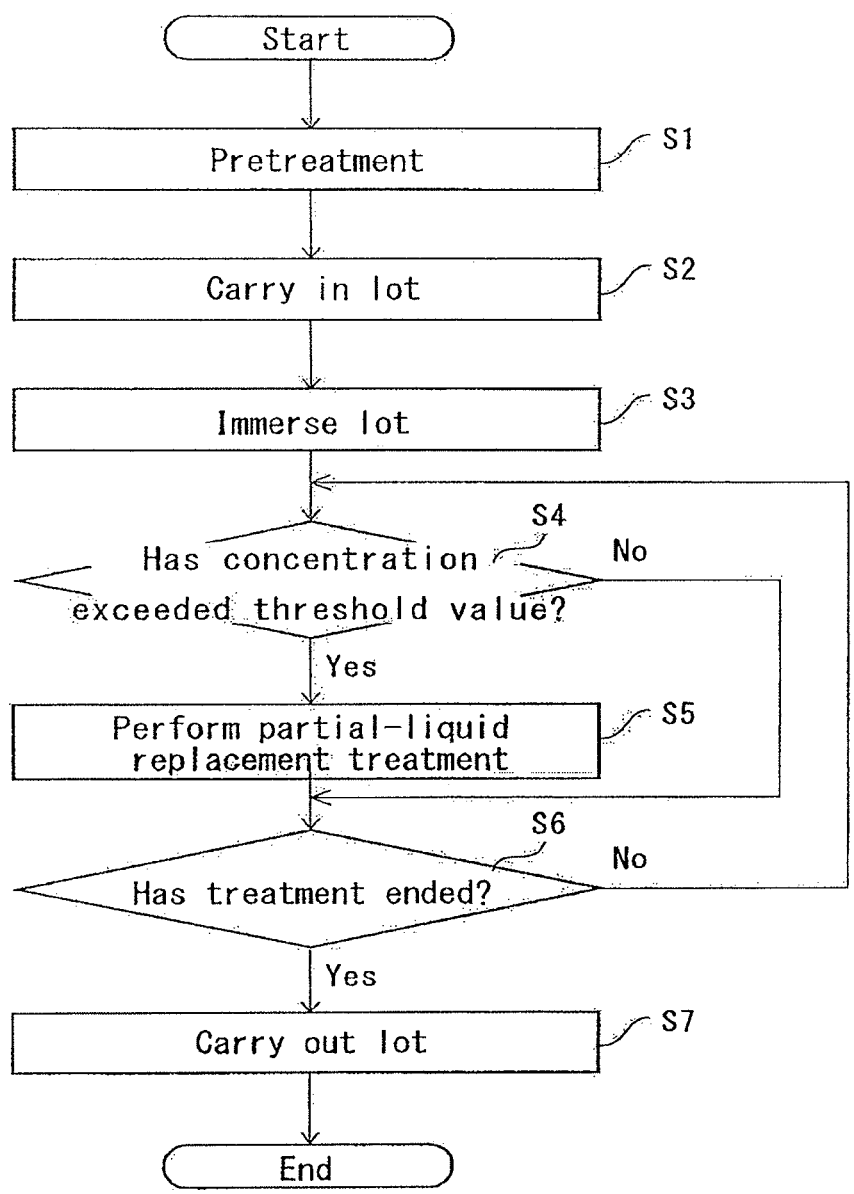
FIG. 4 is a treatment flowchart showing an example of a treatment according to the first embodiment.

FIG. 4 is a treatment flowchart showing an example of the treatment according to the present embodiment. In the present embodiment, silicon nitride film (SiN) etching using phosphoric acid will be described as an example. In the following description, the treating tank 7a will be taken as an example, and a similar treatment can be also performed in the other treating tanks.

When the treatment is started, the substrate treating device 1 performs a pretreatment (FIG. 4: Si) for generating a treating liquid of a predetermined concentration. Specifically, the control unit 55 starts supplying the pure water to the outer tank 50b by opening the pure-water replenishment valve 49. The control unit 55 measures the supply quantity via the pure-water flowmeter 48. At the time point when the supply quantity reaches a predetermined quantity, the control unit 55 ends supplying the pure water by closing the pure-water replenishment valve 49. Thereafter, the control unit starts supplying the chemical liquid to the outer tank 50b by opening the chemical-liquid replenishment valve 45. Further, the control unit 55 starts temperature adjustment by circulating the treating liquid in the circulation line 20. Then, the control unit 55 measures the supply quantity via the chemical-liquid flowmeter 44. When a ratio of the supply quantity of the pure water to the supply quantity of the chemical liquid (that is, a concentration) reaches a predetermined target value, the control unit 55 ends supplying the chemical liquid by closing the chemical-liquid replenishment valve 45. Thereafter, when the temperature of the treating liquid reaches a predetermined target value, the control unit 55 completes the pretreatment. Even after the pretreatment is completed, the circulation of the treating liquid in the circulation line 20 is continued.

Next, after completing the pretreatment, the lot is carried in the substrate treating device 1 (S2) In the present step, the control unit 55 conveys the substrates W to the treating units 5, 7, and 9, by driving the main conveying mechanism 17 and the lifters 11, 13, and 15. A so-called batch treatment is performed by collecting a plurality of substrates W. Thereafter, the substrate treating device 1 immerses the lot (S3). In the present step, the control unit 55 immerses the substrates W into the inner tank 50a by driving the lifter 13. In this way, the etching treatment is started.

Next, the substrate treating device 1 determines whether the SiN concentration of the treating liquid has exceeded a predetermined threshold value (S4). In the present step, the control unit 55 acquires the concentration of an SiN component from the concentration meter 24, and determines whether the concentration has exceeded a predetermined concentration. The threshold value has fixed upper and lower limits, for example. When the concentration becomes higher than the upper limit or becomes lower than the lower limit, the control unit 55 determines that the concentration has exceeded the threshold value.

When it is determined that the concentration has exceeded the threshold value (S4: Yes), the substrate treating device 1 performs a partial-liquid replacement treatment (S5). The partial-liquid replacement treatment is a treatment for discharging a part of the treating liquid from the treating tank 7a, supplying a chemical liquid or pure water to the treating tank 7a, and partially replacing the treating liquid. In the present step, the control unit 55 causes the concentration control device 40 to replenish the treating liquid to the treating tank 7a, and a part of the treating liquid to be discharged from the discharge port 60 when the treating liquid overflows from the outer tank 50b. Specifically, when the SiN concentration exceeds the upper limit threshold value, the concentration control device 40 supplies the pure water and the chemical liquid (phosphoric acid). The partial-liquid replacement treatment continues until the concentration of the treating liquid lies within a predetermined range.

After the partial-liquid replacement treatment, or in S4, when it is determined that the SiN concentration of the treating liquid has not yet exceeded the threshold value (S4: No), the substrate treating device 1 determines whether to end the treatment (S6). In the present step, when a predetermined time has passed from the immersion of the lot, for example, the control unit 55 determines to end the batch treatment of the substrates W to be treated. When the treatment is determined not to be ended (S6: No), the process returns to S4, and the substrate treating device 1 repeats the treatment.

On the other hand, when the treatment is determined to be ended (S6: Yes), the lot is carried out from the substrate treating device 1 (S7). In the present step, the control unit 55 lifts the substrates W to the outside of the inner tank 50a by driving the lifter 13. Further, the control unit 55 conveys the substrates W to the adjacent rinse tank (the treating tank 7b), by driving the main conveying mechanism 17 and the lifters 11, 13, and 15.

Thus, the batch treatment for one lot is completed. In the case of continuing the treatment of other substrates W, the lot may be carried in (S2) by omitting the pretreatment (S1) in FIG. 4.

(Effects)

In the present embodiment, the treating liquid is partially replaced during the etching treatment. With this arrangement, the concentration of the treating liquid can be kept within a predetermined range in also the process in which there is a large quantity of a silicon nitride film dissolved in the treating liquid in the etching, such as formation of a three-dimensional NAND, for example.

In the nitride film etching using phosphoric acid, for example, when the silicon nitride (SiN) concentration of the treating liquid becomes excessively low, the silicon oxide film ($SiO_2$) is also dissolved. Therefore, concentration adjustment of the treating liquid is important. That is, when a large quantity of phosphoric acid and pure water are rapidly supplied, there is a risk that the silicon nitride concentration becomes too low, which is not desirable. Further, the temperature of the treating liquid is also an important element for generating a desired dissolution reaction in the etching. In the present embodiment, as schematically shown in FIG. 3, the treating liquid (the chemical liquid or the pure water) is replenished to the outer tank 50b. The outer tank 50b is a region partitioned from the inner tank 50a into which the substrates W are immersed. By replenishing the treating liquid to the outer tank 50b, the concentration and the temperature of the treating liquid around the substrates W are prevented from being rapidly changed. Further, in FIG. 3, the outlet ports of the chemical liquid line 42 and the pure water line 47 are provided near the inlet port of the circulation line 20 provided on the bottom surface of the outer tank 50b. With this arrangement, a rapid discharge of newly supplied chemical liquid and pure water from the discharge port can be suppressed.

Further, from the inner tank 50a, in which the substrates W are immersed into the treating liquid, to the outer tank 50b, the treating liquid that has overflowed from the outer-wall upper end of the inner tank 50a that partitions between the inner tank 50a and the outer tank 50b flows in. For discharging the liquid from the outer tank 50b, an overflow treating liquid is discharged from the discharge port 60 provided on the outer-wall upper part of the outer tank 50b. With this arrangement, particles of impurities generated by etching and floating on the liquid surface of the treating liquid can be easily removed.

The circulation line 20 filters the treating liquid and adjusts the temperature of the treating liquid, and recirculates the treating liquid downward in the inner tank 50a. With this arrangement, the temperature inside the inner tank 50a can be kept within a predetermined range, and a rapid change in the temperature around the substrates W can be suppressed.

In the etching treatment, temperature management of the treating liquid is important. By performing preliminary temperature adjustment, a change in the temperature attributable to the replenishment of the treating liquid can be reduced.

Second Embodiment

Figure 5:
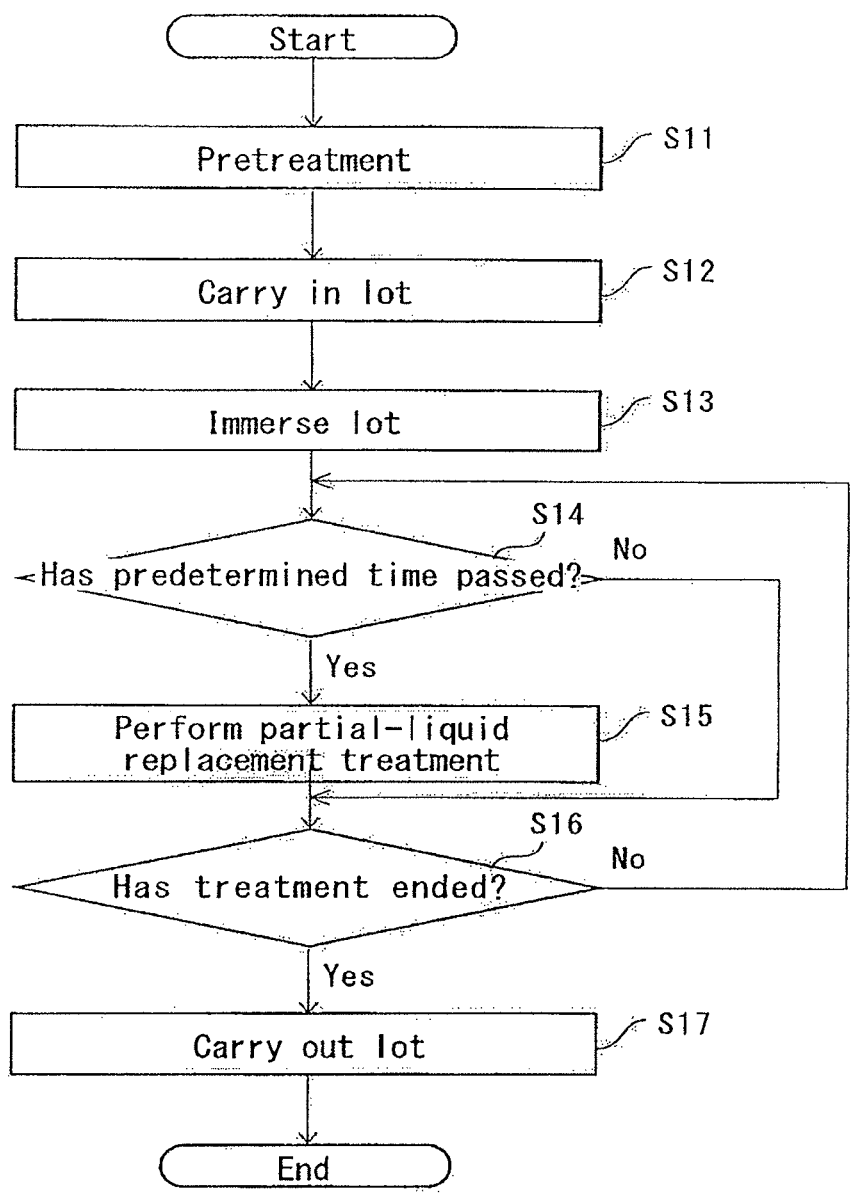
FIG. 5 is a treatment flowchart showing an example of a treatment according to a second embodiment.

FIG. 5 is a treatment flowchart showing an example of a treatment according to a second embodiment. Because the treatments in S11 to S13 and S15 to S17 in FIG. 5 are similar to the treatments in S1 to S3 and S5 to S7 in FIG. 4, a description of the treatments in S11 to S13 and S15 to S17 in FIG. 5 will be omitted. In the present embodiment, when it is determined in S14 that a predetermined time has passed from the start of the treatment (S14: Yes), the substrate treating device 1 performs a partial-liquid replacement treatment (S15).

When the number of substrates to be treated in the batch treatment is known in advance, it is possible to forecast how long it will take from the start of the treatment before the concentration of the treating liquid deviates from a permissible range. The quantity of the treating liquid that requires replacement increases in proportion to the quantity of substrates to be treated. Therefore, in the present embodiment, a replacement quantity of the treating liquid per one substrate and per predetermined treating time is defined in advance. The control unit 55 controls the replacement quantity according to the number of the substrates to be treated.

As described above, the concentration of the treating liquid can be kept in a predetermined range, also in the mode of replenishing the treating liquid based on the information (recipe) that defines the supply timing and the supply quantity based on the treatment-start time point, for example.

Third Embodiment

In the example shown in FIG. 3, the adjacent treating tank 5b is utilized for the chemical-liquid supply source 41. Instead, the chemical-liquid supply source 41 may be configured to supply normal-temperature phosphoric acid manufactured in the factory to the treating tank 7a.

In the example shown in FIG. 3, the outlet ports of the chemical liquid line 42 and the pure water line 47 are provided near the inlet port of the circulation line 20 provided on the bottom surface of the outer tank 50b. The chemical liquid and the pure water that are additionally supplied are first drawn by a large quantity into the circulation line 20, and are supplied to the inner tank 50a after the temperatures of the chemical liquid and the pure water are raised by the temperature adjuster 22. Therefore, even when the normal-temperature chemical liquid and pure water are supplied to the outer tank 50b, a temperature change in the inner tank 50a can be suppressed.

Fourth Embodiment

Figure 6:
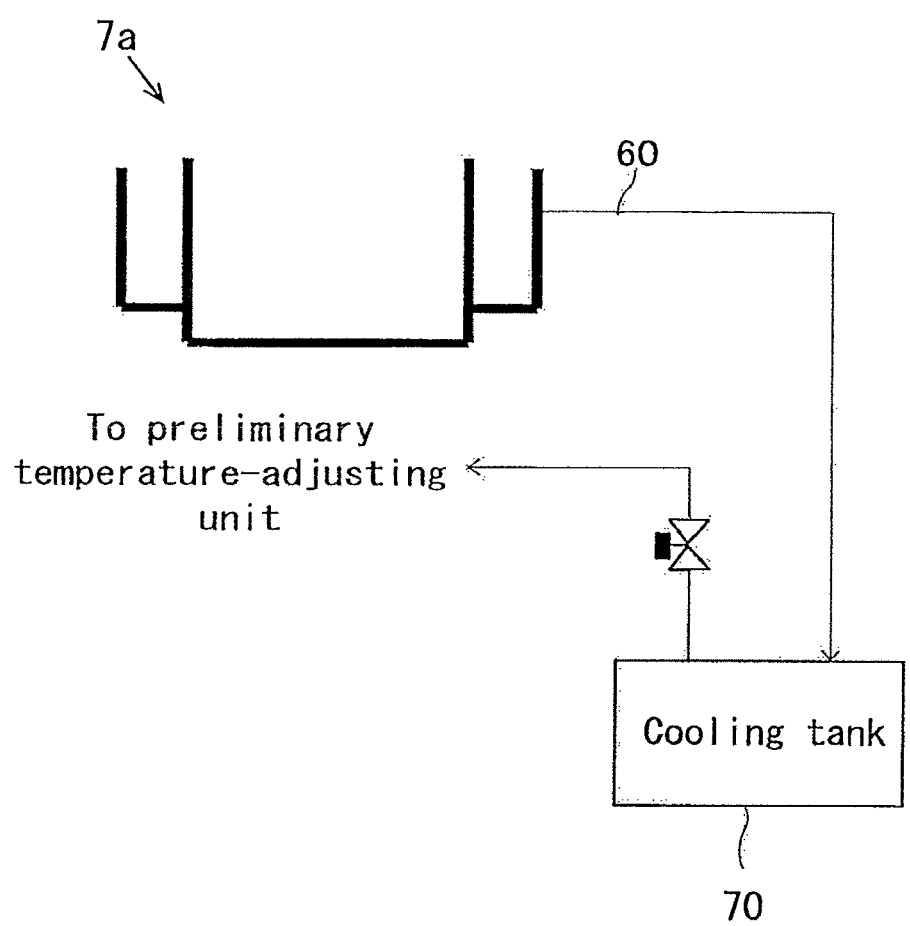
FIG. 6 is a functional block diagram showing an example of a regeneration treating unit that regenerates a treating liquid.

FIG. 6 is a functional block diagram showing an example of a regeneration treating unit that regenerates a treating liquid. The regeneration treating unit includes a cooling tank 70 that is connected to the discharge port 60 of the treating tank 7a and the preliminary temperature-adjusting unit. The cooling tank 70 stores the treating liquid discharged from the discharge port 60 and cools the treating liquid, and precipitates the SiN dissolved in the treating liquid. Further, a valve is provided on the outflow port of the cooling tank 70. By opening the valve, the treating liquid after precipitation of the SiN is recirculated to the preliminary temperature-adjusting unit. Thereafter, the temperature of the treating liquid recirculated from the cooling tank 70 is raised by the preliminary temperature-adjusting unit. The treating liquid is then returned to the treating tank 7a via the chemical liquid line 42.

With this arrangement, the phosphoric acid in the treating liquid can be utilized again for the etching treatment, by regenerating the phosphoric acid in the treating liquid. By providing a filter also on the outflow port of the cooling tank 70, the precipitated SiN may be removed. There may be further provided a filter regenerating unit (not shown) that regenerates the function of the filter by using hydrofluoric acid.

Fifth Embodiment

Figure 7:
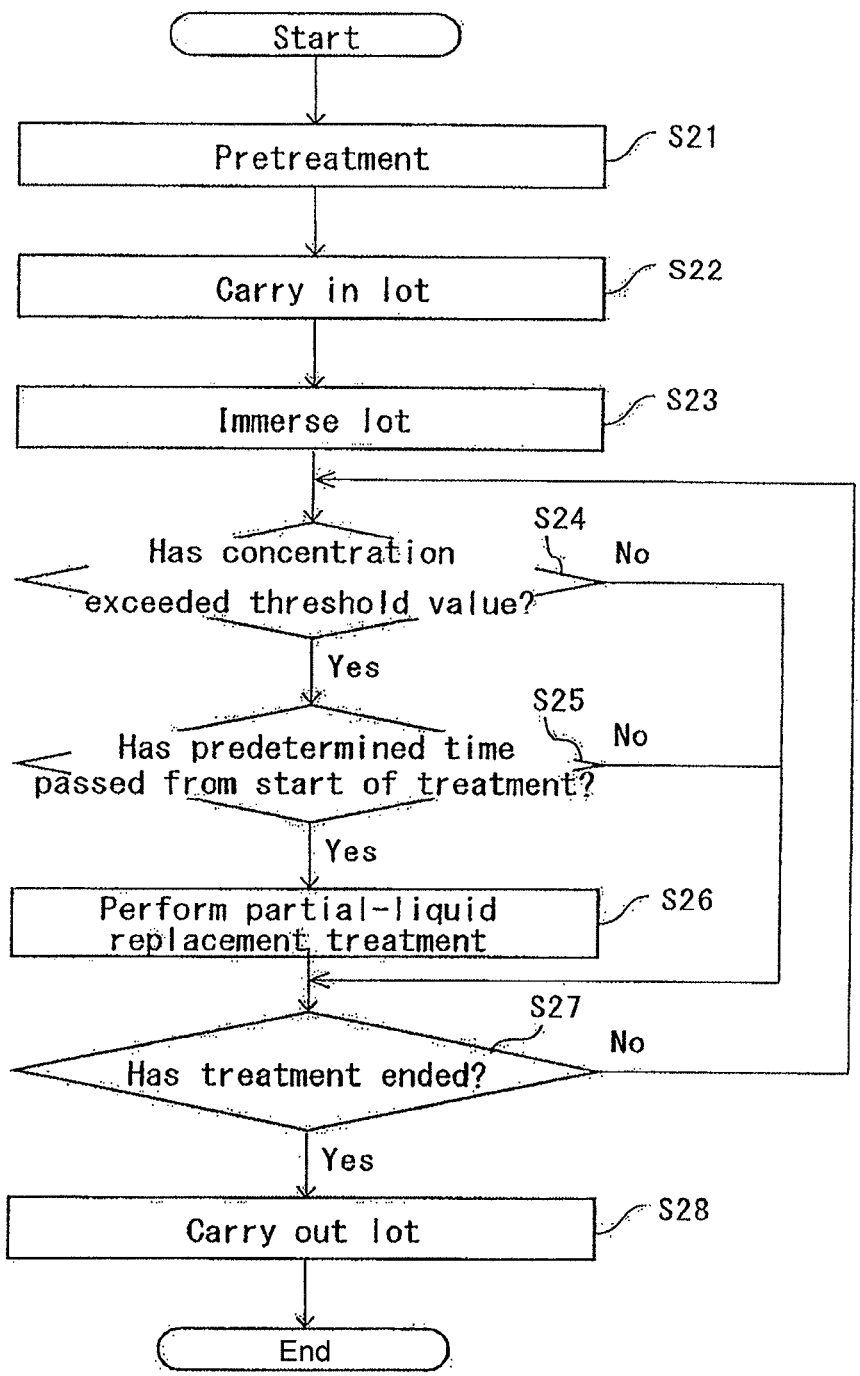
FIG. 7 is a treatment flowchart showing an example of a treatment according to a fifth embodiment.

FIG. 7 is a treatment flowchart showing an example of a treatment according to a fifth embodiment. Because the treatments in S21 to S24 and S26 to S28 in FIG. 7 are similar to the treatments in S1 to S4 and S5 to S7 in FIG. 4, a description of the treatments in S21 to S24 and S26 to S28 in FIG. 7 will be omitted. In the present embodiment, when it is determined in S25 that a predetermined time has passed from the start of the batch treatment (S25: Yes), the substrate treating device 1 performs a partial-liquid replacement treatment (S26).

Immediately after the start of the batch treatment, there is a tendency that it takes time for the temperature to recover from a temperature reduction. Therefore, in the present embodiment, replenishment of the treating liquid is not performed until a predetermined time elapses. With this arrangement, a temperature reduction of the treating liquid in the treating tank can be avoided. Specifically, during a period from the input of a treatment lot until about when the circulation of the treating liquid ends, control is performed such that replenishment is not performed. This time is stored as a parameter into the memory unit 57 (FIG. 2) that can be accessed by the control unit 55. For example, this time is set to about two to five minutes.

<Others>

The outlet port of the chemical liquid line 42 for replenishing the chemical liquid and the outlet port of the pure water line 47 for replenishing the pure water may be variable needles of which opening areas change or may be fixed needles of which opening areas do not change. In the case of a variable needle, the control unit 55 adjusts the flow rate by using a replenishment flow rate as a parameter. In the case of a fixed needle, the control unit 55 adjusts the flow rate by using the time of performing the replenishment as a parameter.

Figure 8:
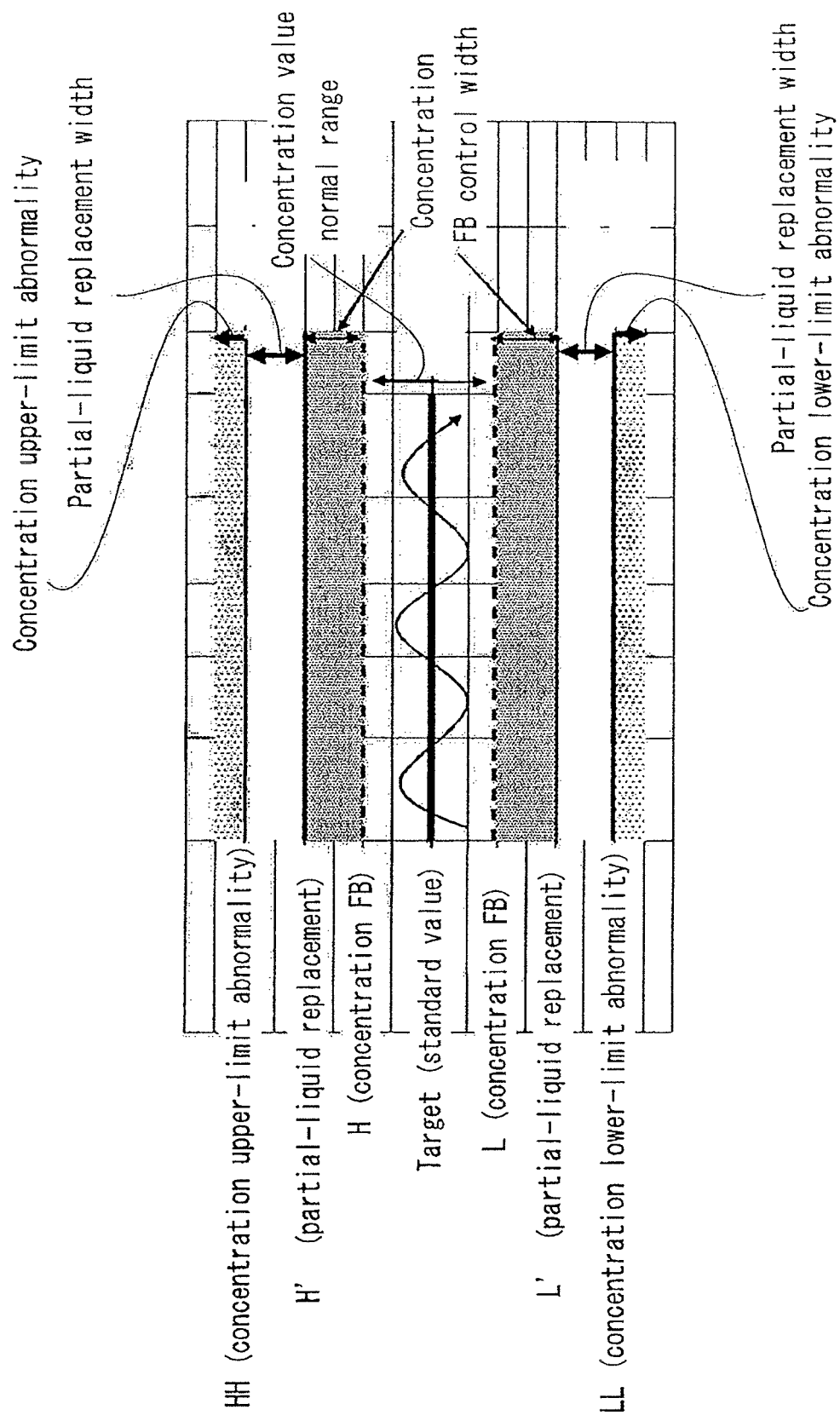
FIG. 8 is a graph for describing an example of changing the quantity of a chemical liquid or pure water to be supplied, in accordance with the concentration of SiN in a treating liquid by providing a plurality of threshold values.

FIG. 8 is a graph for describing an example of changing the quantity of a chemical liquid or pure water to be supplied, in accordance with the concentration of SiN in a treating liquid by providing a plurality of threshold values. The threshold value used in S4 in FIG. 4 may be defined at stages by a plurality of number. The threshold values are stored in advance into the memory unit 57 (FIG. 2) that can be accessed by the control unit 55. For example, as shown in FIG. 8, there are defined a standard value that becomes a target of concentration, "H (concentration FB)" and "L (concentration FB)" as a threshold value on a high concentration (upper limit) side and a threshold value on a low concentration (lower limit) side for starting a concentration feedback control when the concentration has exceeded the threshold value, "H' (partial-liquid replacement)" and "L' (partial-liquid replacement" as a threshold value on a high concentration side and a threshold value on a low concentration side for starting a partial-liquid replacement treatment when the concentration has exceeded the threshold value, and "HH (concentration upper-limit abnormality)" and "LL (concentration lower-limit abnormality)" as a threshold value on a high concentration side and a threshold value on a low concentration side for generating an alarm and stopping the treatment when the concentration has exceeded the threshold value. The "H' (partial-liquid replacement)" is a value expressing a higher concentration than the "H (concentration FB)". The "HH (concentration upper-limit abnormality)" is a value expressing a higher concentration than the "H' (partial-liquid replacement)". Further, the "L' (partial-liquid replacement)" is a value expressing a lower concentration than the "L (concentration FB)". Then, the "LL (concentration lower-limit abnormality)" is a value expressing a lower concentration than the "L' (partial-liquid replacement)", These threshold values are stored in advance in tables of the memory unit 57 (FIG. 2) that can be accessed by the control unit 55. A plurality of tables may be prepared in advance, and the operator may appropriately select the tables. The operator may input or select a table through the front panel of the substrate treating device 1 or by communication via an external computer or a mobile terminal.

The concentration feedback control is a treatment of replenishing a small quantity of a chemical liquid or pure water which does not cause discharge of the treating liquid. In the concentration feedback control, pure water is gradually supplied in the "concentration FB control width" from H to H' in FIG. 8, and the chemical liquid is gradually supplied in the "concentration FB control width" from L to L' in FIG. 8. The partial-liquid replacement treatment is a treatment of discharging a part of the treating liquid and replenishing the chemical liquid or the pure water in a similar manner to that of the above embodiment. In the partial-liquid replacement treatment, pure water is supplied in the EAQ width from H' to HH in FIG. 8 and the treating liquid that has overflowed from the treating tank is discharged, and the chemical liquid is supplied in the EAQ width from L' to LL and the treating liquid that has overflowed from the treating tank is discharged. The total liquid replacement treatment is a treatment of replacing the treating liquid completely when the treating liquid cannot be regenerated in the partial-liquid replacement treatment. When the concentration has become higher than HH or lower than LL in FIG. 8, alarm is generated and the treatment is stopped. Thereafter, the treating liquid is completely discharged from the treating tanks and the like, and the treatment is performed again from the pretreatment (FIG. 3: S1).

In the treatment flowcharts in FIGS. 9, 5, and 7, the partial-liquid replacement treatment is performed after the immersion of the lot and before the carrying-out of the lot. Instead, the partial-liquid replacement treatment may be performed independently of the carrying-in, immersion, and carrying-out of the lot. For example, in the case of continuously treating a plurality of lots, the partial-liquid replacement treatment is appropriately performed according to the SiN concentration, during a period from the carrying-out of the lots after the treatment until the carrying-in and immersion of the lots to be newly treated. In the case of combining with the fifth embodiment, when a new lot is carried in the course of the partial-liquid replacement treatment, the partial-liquid replacement treatment is stopped until a predetermined time has passed from the start of the batch treatment to the new lot.

The concentration of the component of the chemical liquid contained in the treating liquid also changes when the component contained in the treating liquid evaporates in addition to degradation of a predetermined component by a chemical reaction. With this arrangement, a treatment for bringing the concentration to a target value can be appropriately selected in accordance with a plurality of threshold values.

The outer tank 50b may not be provided over a whole periphery of the inner tank 50a in a plan view. For example, when a portion adjacent to the outer tank 50b is shorter than other portions out of the outer wall of the inner tank 50a, the treating liquid that has overflowed from the inner tank 50a flows into the outer tank 50b. Therefore, the outer tank 50b may be provided on at least a part of the surrounding of the inner tank 50a.

By preparing in advance a phosphoric acid aqueous solution in which SiN is dissolved in a high concentration, the phosphoric acid aqueous solution may be replenished when the concentration becomes lower than the "L (concentration FB)" or the "L' (partial-liquid replacement)" in FIG. 8.

In FIG. 3, an example of utilizing a so-called in-line concentration type meter is shown. Instead, there may be used a sampling type concentration meter that measures a concentration by extracting a part of a liquid.

Further, by measuring a hydrogen-ion exponent (pH) or an electric conductivity instead of the SiN concentration, a measured result may be converted into the SiN concentration.

In the example in FIG. 3, the chemical liquid or pure water is replenished to the outer tank 50b. Instead, the chemical liquid and pure water may be replenished to the inner tank 50a. A desired quantity of the chemical liquid or pure water may be replenished to the outer tank 50b or the inner tank 50a by controlling the pump instead of opening and closing the chemical-liquid replenishment valve 45 or the pure-water replenishment valve 49.

The treatments according to the first to fourth embodiments and other treatments can be performed by combing the treatments to an achievable extent.

What is claimed is:

1. A substrate treating method using a treating liquid that contains phosphoric acid and pure water for performing an etching treatment of a silicon nitride film on a substrate on which the silicon nitride film is formed, the method comprising:
   a supplying step of supplying the phosphoric acid or the pure water to a treating tank in which the treating liquid with which the etching treatment is performed on the substrate is stored;
   a treatment step of immersing the substrate into the treating liquid, which contains the phosphoric acid and the pure water;
   a control step of controlling supply of the phosphoric acid or the pure water in the supplying step;
   a discharging step of discharging the treating liquid stored in the treating tank concurrently with the supplying step, the treatment step and the control step; and
   a concentration measuring step of measuring a concentration of dissolved silicon nitride in the treating liquid,
   wherein the control step comprises:
   performing a partial-liquid replacement, including discharging a part of the treating liquid from the treating tank, and supplying phosphoric acid or the pure water to the treating tank, for partially replacing the treating liquid,
   the partial-liquid replacement being performed when the concentration of dissolved silicon nitride in the treating liquid has exceeded a predetermined threshold value.

2. The substrate treating method according to claim 1, wherein
   the treating tank has an inner tank with which the etching treatment is performed on the substrate, and an outer tank which is provided around the inner tank and into which the treating liquid that overflows from the inner tank flows,
   the substrate treating method comprises a circulating step for recirculating a treating liquid in the outer tank to the inner tank, and
   in the supplying step, the chemical liquid phosphoric acid or the pure water is supplied to the outer tank.

3. The substrate treating method according to claim 1, wherein in the supplying step, a temperature of the phosphoric acid or the pure water before being supplied is adjusted.

4. The substrate treating method according to claim 1, wherein in the control step, a quantity of the phosphoric acid or the pure water supplied in the supplying step is controlled, in accordance with a concentration measured in the concentration measuring step.

5. The substrate treating method according to claim 1, wherein in the control step, a quantity of the phosphoric acid or the pure water supplied in the supplying step is controlled, based on a lapse of time in the treatment step.

6. The substrate treating method according to claim 1, further comprising a regeneration treating step of precipitating a solute, dissolved in the treating liquid from the substrate in the etching treatment, out of the treating liquid discharged in the discharging step, removing the solute, and regenerating the treating liquid,
   wherein in the regeneration treating step, the regenerated treating liquid is supplied to the treating tank.

7. The substrate treating method according to claim 2, wherein in the circulating step, a temperature of the treating liquid is adjusted and the treating liquid is filtered.

8. The substrate treating method according to claim 2, wherein in the discharging step, the treating liquid is discharged from an overflow pipe that is provided on a vertically upper part of a side surface of the outer tank.

* * * * *